United States Patent
Lee et al.

(10) Patent No.: US 12,363,890 B2
(45) Date of Patent: Jul. 15, 2025

(54) SEMICONDUCTOR DEVICE INCLUDING PERIPHERAL CONTACT

(71) Applicant: SAMSUNG ELECTRONICS CO., LTD., Suwon-si (KR)

(72) Inventors: Jinseong Lee, Gyeonggi-do (KR); Kyounghee Kim, Hwaseong-si (KR); Dongsoo Woo, Seoul (KR); Kyosuk Chae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 378 days.

(21) Appl. No.: 17/724,685

(22) Filed: Apr. 20, 2022

(65) Prior Publication Data

US 2023/0109983 A1    Apr. 13, 2023

(30) Foreign Application Priority Data

Oct. 13, 2021 (KR) .......... 10-2021-0135693

(51) Int. Cl.
  *H10B 12/00*  (2023.01)
(52) U.S. Cl.
  CPC .......... *H10B 12/50* (2023.02); *H10B 12/315* (2023.02); *H10B 12/34* (2023.02)
(58) Field of Classification Search
  CPC ....... H10B 12/50; H10B 12/315; H10B 12/34
  See application file for complete search history.

(56) References Cited

U.S. PATENT DOCUMENTS

| | | | |
|---|---|---|---|
| 8,669,165 B2 | 3/2014 | Han et al. | |
| 9,917,091 B2 | 3/2018 | Kugimiya et al. | |
| 10,559,569 B2 | 2/2020 | Jang et al. | |
| 2002/0024085 A1* | 2/2002 | Nakamura | H10B 12/0335 257/306 |
| 2004/0110854 A1 | 6/2004 | Lyu et al. | |
| 2015/0155163 A1 | 6/2015 | Kim et al. | |
| 2020/0152634 A1 | 5/2020 | Lee et al. | |

FOREIGN PATENT DOCUMENTS

| | | | |
|---|---|---|---|
| JP | 2015-154028 A | 8/2015 | |
| KR | 1998-076583 A | 11/1998 | |
| KR | 10-2004-0049065 A | 6/2004 | |
| KR | 1020050114035 A | 12/2005 | |
| KR | 10-2013-0128502 A | 11/2013 | |

* cited by examiner

*Primary Examiner* — Jay C Kim
*Assistant Examiner* — Woo K Lee
(74) *Attorney, Agent, or Firm* — Muir Patent Law, PLLC

(57) ABSTRACT

A semiconductor device including a cell active pattern; a cell gate structure connected to the cell active pattern; a peripheral active pattern; a peripheral gate structure connected to the peripheral active pattern; a conductive pattern connected to the peripheral active pattern, the cell gate structure, or the peripheral gate structure; a capacitor structure electrically connected to the cell active pattern; an interlayer insulating layer surrounding the capacitor structure; and a peripheral contact connected to the conductive pattern while extending through the interlayer insulating layer, wherein the interlayer insulating layer includes a first material layer contacting the capacitor structure, and a second material layer on the first material layer, the peripheral contact includes a first portion contacting the first material layer, and a second portion contacting the second material layer, and a maximum width of the first portion is greater than a minimum width of the second portion.

20 Claims, 12 Drawing Sheets

SEMICONDUCTOR DEVICE INCLUDING PERIPHERAL CONTACT

CROSS-REFERENCE TO THE RELATED APPLICATION

This application claims priority from Korean Patent Application No. 10-2021-0135693, filed on Oct. 13, 2021, in the Korean Intellectual Property Office, the disclosure of which is incorporated herein by reference in its entirety.

BACKGROUND

1. Field

Embodiments of the disclosure relate to a semiconductor device including a peripheral contact.

2. Description of the Related Art

A semiconductor device is being highlighted as an important element in electronics industries by virtue of characteristics thereof such as miniaturization, multifunctionalization, low manufacturing costs, etc. Semiconductor devices may include a semiconductor memory device configured to store logic data, a semiconductor logic device configured to arithmetically process logic data, a hybrid semiconductor device including a memory element and a logic element, or the like. In accordance with high advances in electronics industries, demand for characteristics of semiconductor devices is gradually increasing.

SUMMARY

The embodiments may be realized by providing a semiconductor device including a cell active pattern; a cell gate structure connected to the cell active pattern; a peripheral active pattern; a peripheral gate structure connected to the peripheral active pattern; a conductive pattern connected to the peripheral active pattern, the cell gate structure, or the peripheral gate structure; a capacitor structure electrically connected to the cell active pattern; an interlayer insulating layer surrounding the capacitor structure; and a peripheral contact connected to the conductive pattern while extending through the interlayer insulating layer, wherein the interlayer insulating layer includes a first material layer contacting the capacitor structure, and a second material layer on the first material layer, the peripheral contact includes a first portion contacting the first material layer, and a second portion contacting the second material layer, and a maximum width of the first portion of the peripheral contact is greater than a minimum width of the second portion of the peripheral contact.

The embodiments may be realized by providing a semiconductor device including a cell active pattern; a cell gate structure connected to the cell active pattern; a capacitor structure electrically connected to the cell active pattern; an interlayer insulating layer surrounding the capacitor structure; and a peripheral contact extending through the interlayer insulating layer, wherein the interlayer insulating layer includes a first material layer, and a second material layer having a lower hydrogen concentration than a hydrogen concentration of the first material layer, the first material layer includes a sidewall portion covering an outer sidewall of the capacitor structure, and a first flat portion extending from the sidewall portion, the second material layer is at a higher level than the first flat portion of the first material layer, and surrounds the sidewall portion of the first material layer, the peripheral contact includes a first portion contacting the first flat portion of the first material layer, and a second portion contacting the second material layer, and a maximum width of the first portion is greater than a minimum width of the second portion.

The embodiments may be realized by providing a semiconductor device including a cell active pattern; a cell gate structure connected to the cell active pattern; a capacitor structure electrically connected to the cell active pattern; a first material layer including a sidewall portion covering an outer sidewall of the capacitor structure, and a first flat portion extending from the sidewall portion; and a second material layer surrounding the sidewall portion of the first material layer, wherein the second material layer is at a higher level than the first flat portion of the first material layer, and a hydrogen concentration of the first material layer is higher than a hydrogen concentration of the second material layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
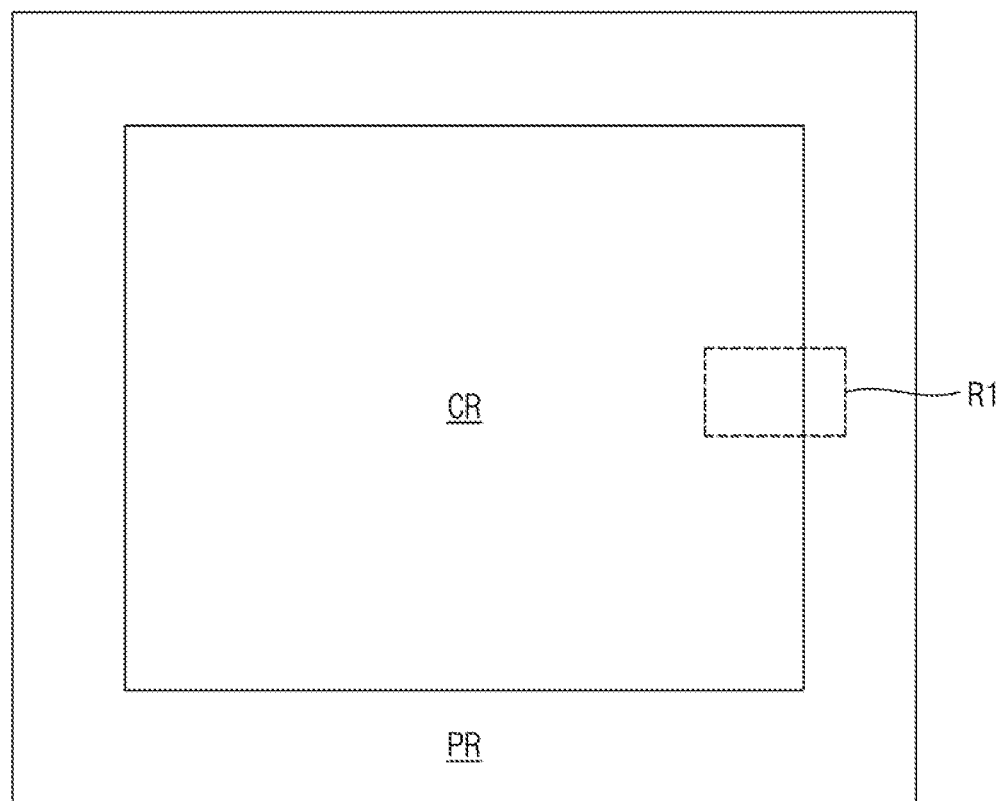
FIG. 1A is a plan view of a semiconductor device according to some exemplary embodiments of the disclosure.
Figure 1A:
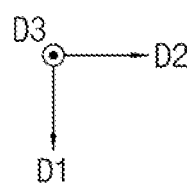
Figure 1B:
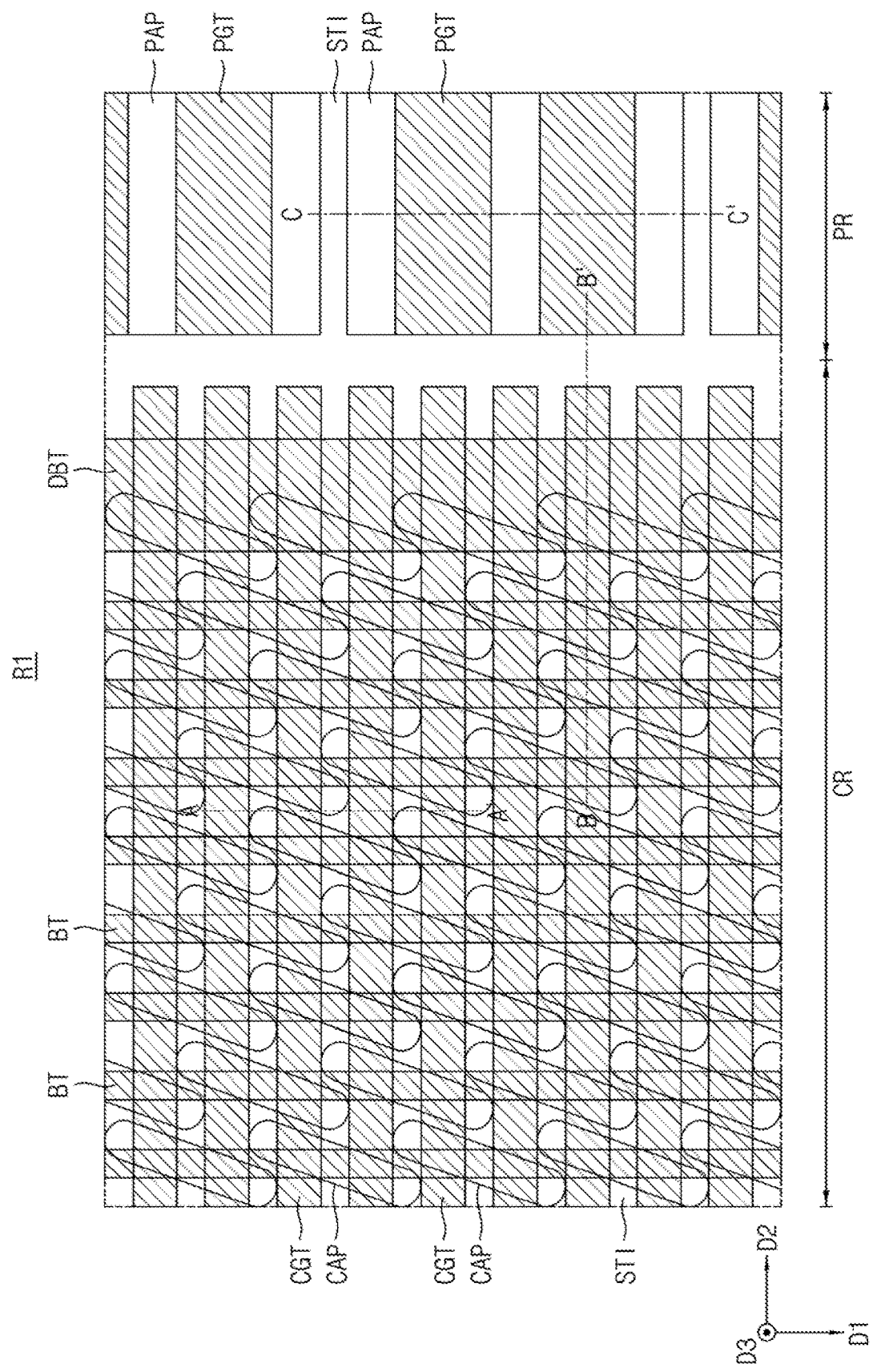
FIG. 1B is an enlarged view of a region R1 of FIG. 1A.
Figure 1C:
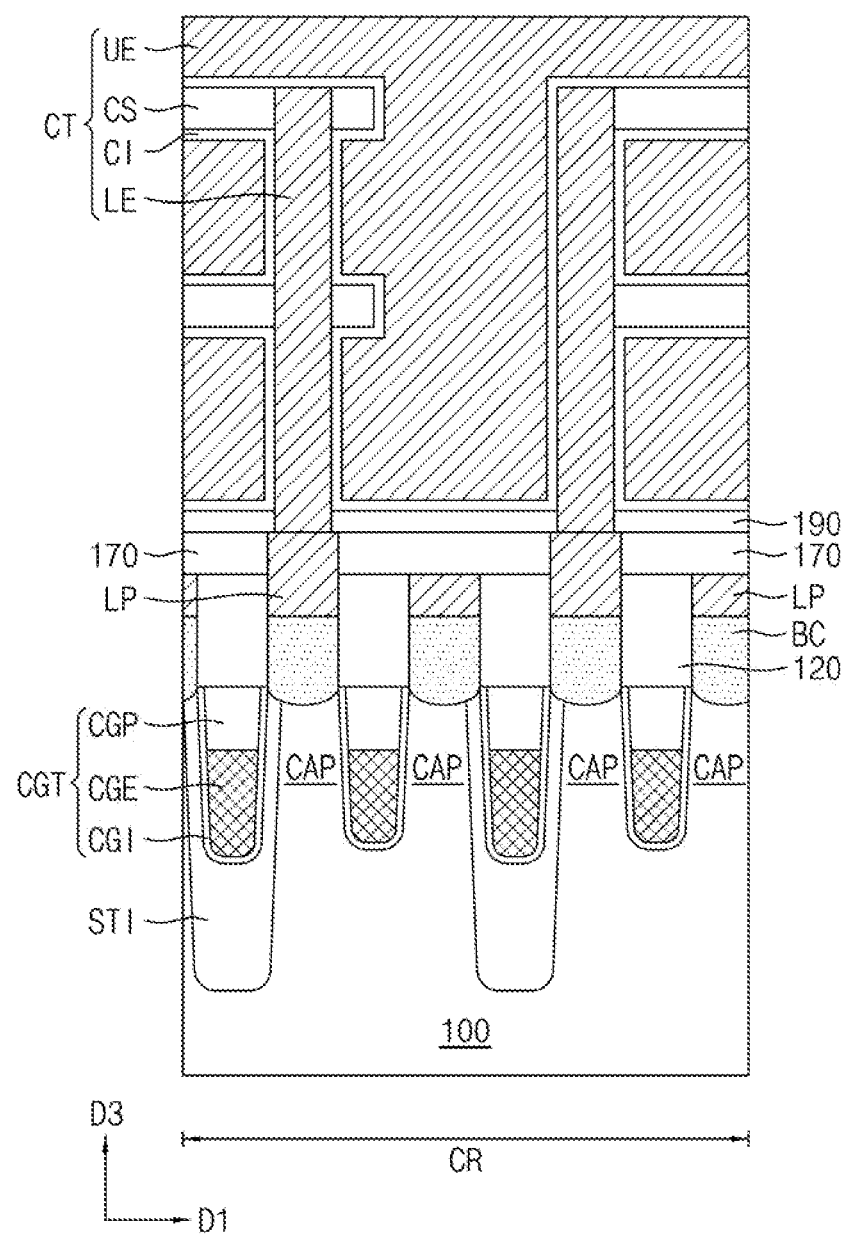
FIG. 1C is a cross-sectional view taken along line A-A' in FIG. 1B.
Figure 1D:
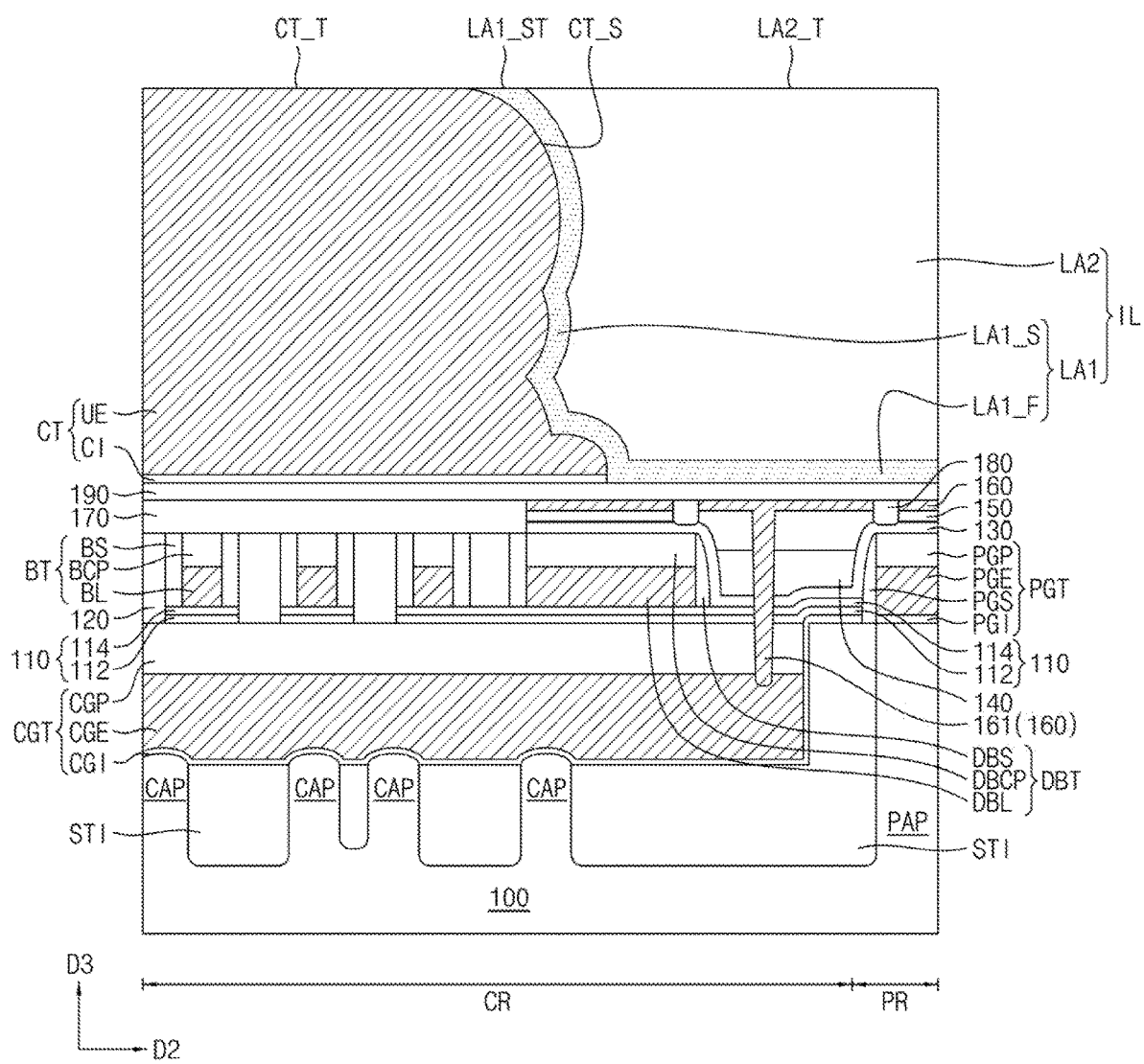
FIG. 1D is a cross-sectional view taken along line B-B' in FIG. 1B.
Figure 1E:
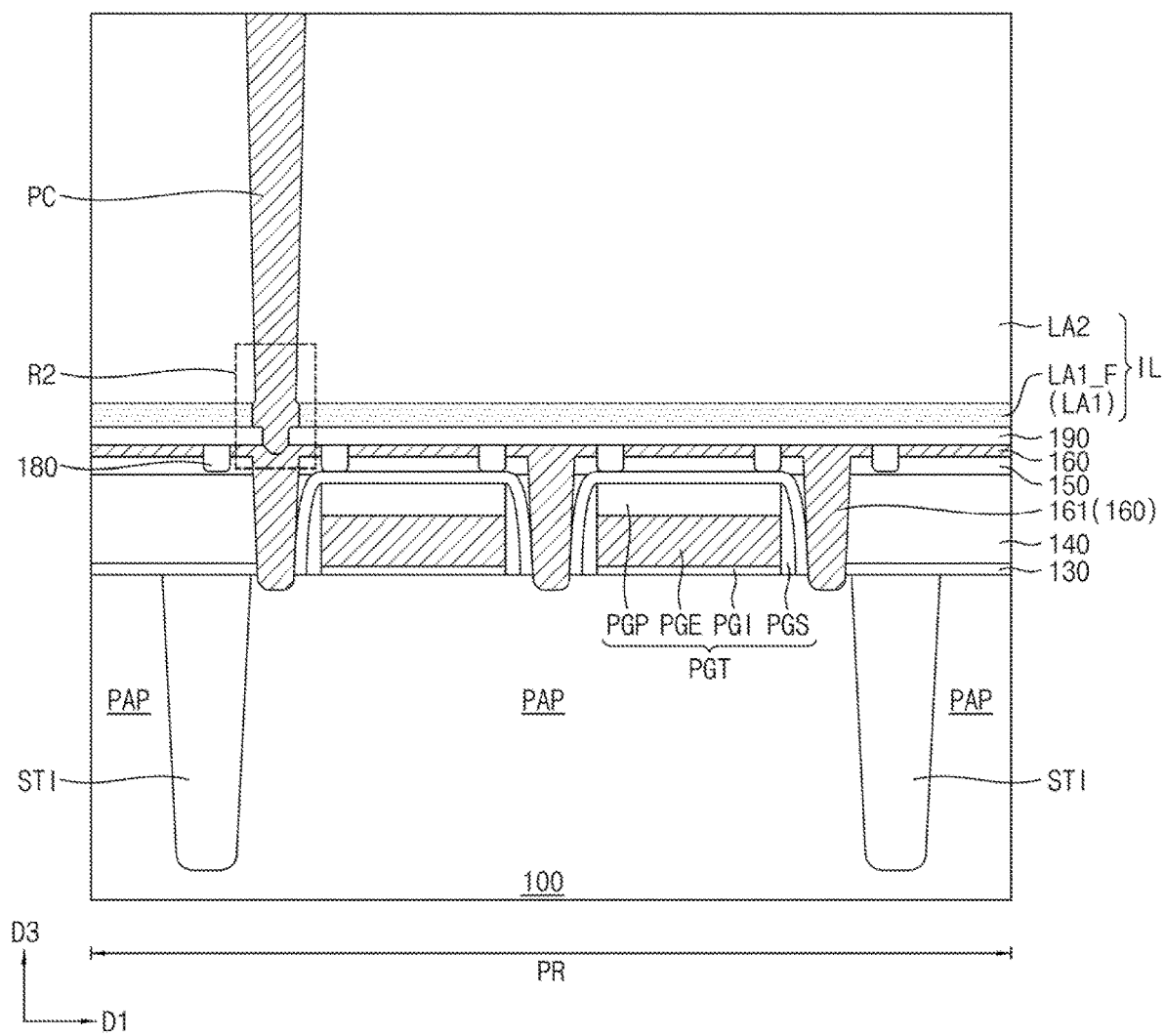
FIG. 1E is a cross-sectional view taken along line C-C' in FIG. 1B.
Figure 1F:
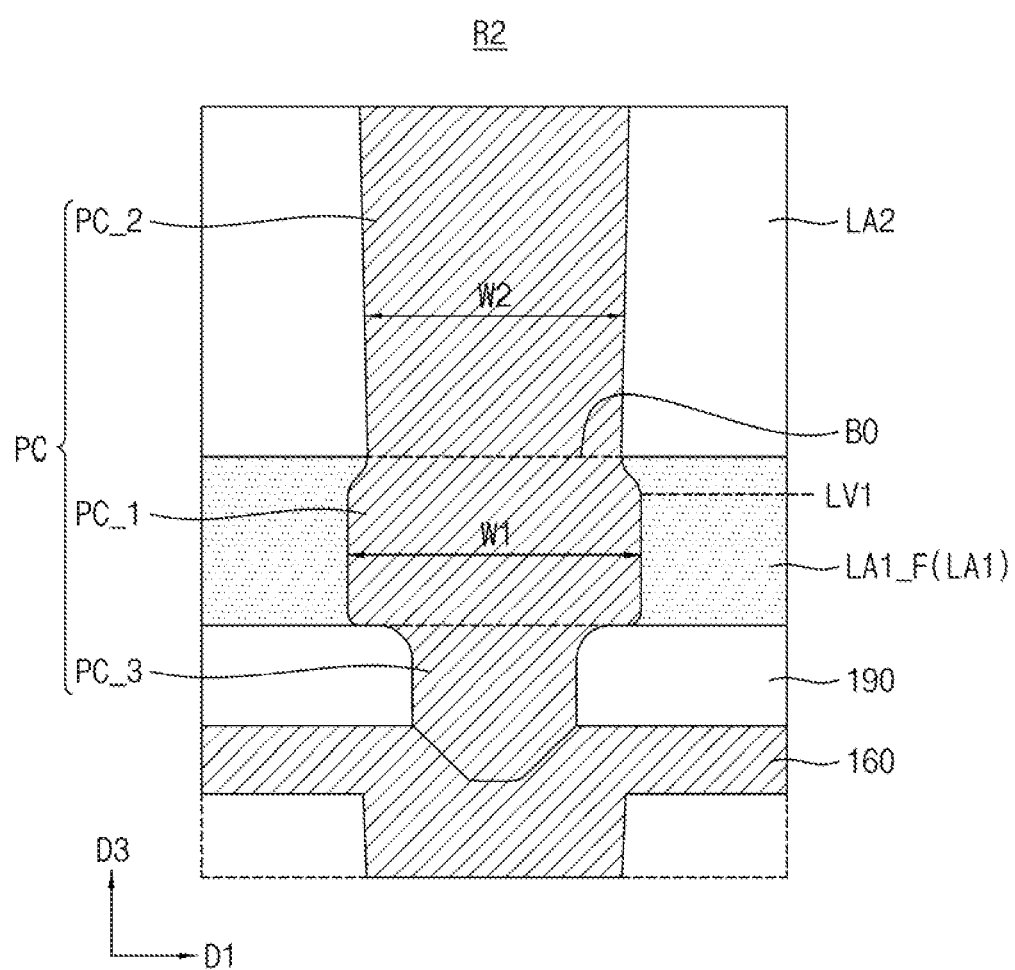
FIG. 1F is an enlarged view of a region R2 of FIG. 1E.

FIG. 1A is a plan view of a semiconductor device according to some exemplary embodiments of the disclosure. FIG. 1B is an enlarged view of a region R1 of FIG. 1A. FIG. 1C is a cross-sectional view taken along line A-A' in FIG. 1B. FIG. 1D is a cross-sectional view taken along line B-B' in FIG. 1B. FIG. 1E is a cross-sectional view taken along line C-C' in FIG. 1B. FIG. 1F is an enlarged view of a region R2 of FIG. 1E.

Referring to FIG. 1A, the semiconductor device according to the exemplary embodiments of the disclosure may include a cell region CR and a peripheral region PR. The cell region CR and the peripheral region PR may be regions divided from each other on a plane defined by a first direction D1 and a second direction D2. The first direction D1 and the second direction D2 may intersect each other. In an implementation, the first direction D1 and the second direction D2 may perpendicularly intersect each other. The peripheral region PR may be a region in which peripheral transistors of the semiconductor device are disposed. The cell region CR may be a region in which cell transistors of the semiconductor device are disposed. The peripheral region PR may surround the cell region CR.

Referring to FIGS. 1B, 1C, 1D and 1E, the semiconductor device may include a substrate 100. In an implementation, the substrate 100 may be a semiconductor substrate. In an implementation, the substrate 100 may include, e.g., silicon, germanium, silicon-germanium, GaP, or GaAs. In an implementation, the substrate 100 may be a silicon-on-insulator (SOI) substrate or a germanium-on-insulator (GOI) substrate. The substrate 100 may have the form of a plate extending along a plane defined by the first direction D1 and the second direction D2. As used herein, the term "or" is not an exclusive term, e.g., "A or B" would include A, B, or A and B.

The substrate 100 may include cell active patterns CAP. The cell active patterns CAP may be in or on the cell region CR. Upper portions of the substrate 100 protruding in a third direction D3 in the cell region CR may be defined as the cell active patterns CAP. The third direction D3 may intersect the first direction D1 and the second direction D2. In an implementation, the third direction D3 may perpendicularly intersect the first direction D1 and the second direction D2. In an implementation, the first direction D1 and the second direction D2 may be horizontal directions, respectively, and the third direction D3 may be a vertical direction, e.g., relative to a plane of the substrate 100. The cell active patterns CAP may be spaced apart from one another.

The substrate 100 may include peripheral active patterns PAP. The peripheral active patterns PAP may be in or on the peripheral region PR. Upper portions of the substrate 100 protruding in the third direction D3 in the peripheral region PR may be defined as the peripheral active patterns PAP. The peripheral active patterns PAP may be spaced apart from one another.

An element isolation layer STI may be in a space among or between the cell active patterns CAP and the peripheral active patterns PAP. The cell active patterns CAP and the peripheral active patterns PAP may be defined by the element isolation layer STI. Each of the cell active patterns CAP may be surrounded by the element isolation layer STI. Each of the peripheral active patterns PAP may be surrounded by the element isolation layer STI. The element isolation layer STI may include an insulating material. In an implementation, the element isolation layer STI may include an oxide.

Cell gate structures CGT extending in the second direction D2 may be provided. The cell gate structures CGT may be in the cell region CR. The cell gate structures CGT may be spaced apart from one another in the first direction D1. The cell gate structure CGT may be on the element isolation layer STI and the cell active patterns CAP. The cell gate structure CGT may be a buried gate structure buried in the cell active patterns CAP and the element isolation layer STI. One cell gate structure CGT may be connected to a plurality of cell active patterns CAP. The cell active patterns CAP may include impurity regions. A cell transistor including the cell gate structure CGT and the impurity regions of the cell active pattern CAP may be defined.

Each of the cell gate structures CGT may include a cell gate insulating layer CGI, a cell gate electrode CGE, and a cell gate capping layer CGP. The cell gate insulating layer CGI may cover surfaces of the cell active patterns CAP and the element isolation layer STI. The cell gate electrode CGE and the cell gate capping layer CGP may be inside the cell gate insulating layer CGI. The cell gate electrode CGE may be spaced apart from the cell active pattern CAP by the cell gate insulating layer CGI. The cell gate capping layer CGP may cover a top surface of the cell gate electrode CGE. The cell gate insulating layer CGI and the cell gate capping layer CGP may include an insulating material. The cell gate electrode CGE may include a conductive material.

Peripheral gate structures PGT extending in the second direction D2 may be provided. The peripheral gate structures PGT may be in the peripheral region PR. The peripheral gate structures PGT may be spaced apart from one another in the first direction D1. The peripheral gate structures PGT may be on the peripheral active pattern PAP. The peripheral gate structure PGT may be connected to the peripheral active pattern PAP. The peripheral active patterns PAP may include impurity regions. A peripheral transistor including the peripheral gate structure PGT and the impurity regions of the peripheral active pattern PAP may be defined.

Each of the peripheral gate structures PGT may include a peripheral gate insulating layer PGI, a peripheral gate electrode PGE, peripheral gate spacers PGS, and a peripheral gate capping layer PGP. The peripheral gate insulating layer PGI may be on the peripheral active pattern PAP. The peripheral gate electrode PGE may be on the peripheral gate insulating layer PGI, and the peripheral gate capping layer PGP may be on the peripheral gate electrode PGE. The peripheral gate electrode PGE may be spaced apart from the peripheral active pattern PAP by the peripheral gate insulating layer PGI. The peripheral gate spacers PGS may be at opposite sides of the peripheral gate insulating layer PGI, the peripheral gate electrode PGE and the peripheral gate capping layer PGP. The peripheral gate insulating layer PGI, the peripheral gate capping layer PGP, and the peripheral gate spacers PGS may include an insulating material. The peripheral gate electrode PGE may include a conductive material.

Insulating patterns 110 may be provided. The insulating patterns 110 may be on the cell gate capping layer CGP of the cell gate structure CGT. The insulating patterns 110 may extend in the first direction D1. The insulating patterns 110 may be spaced apart from one another in the second direction D2. The insulating pattern 110 may include a first insulating layer 112, and a second insulating layer 114 on the first insulating layer 112. The first and second insulating layers 112 and 114 may include different insulating materials, respectively. In an implementation, the insulating pattern 110 may include one insulating layer, or may include three or more insulating layers.

Bit line structures BT extending in the first direction D1 may be provided. The bit line structures BT may be spaced apart from one another in the second direction D2. The bit line structure BT may be on the insulating pattern 110. The bit line structure BT may be electrically connected to the cell active pattern CAP.

A dummy bit line structure DBT extending in the first direction D1 may be provided. The dummy bit line structure DBT may be on the insulating pattern 110. The bit line structures BT and the dummy bit line structure DBT may be in the cell region CR. The dummy bit line structure DBT may be nearer to the peripheral region PR (e.g., in the second direction D2) than the bit line structures BT are to the peripheral region PR.

Each of the bit line structures BT may include a bit line BL, a bit line capping layer BCP, and bit line spacers BS. The bit line BL may extend in the first direction D1. The bit line BL may be on the insulating pattern 110. In an implementation, the bit line BL may be connected to the cell active pattern CAP via a direct contact. The bit line BL may include a conductive material. In an implementation, the bit line BL may include a plurality of conductive layers.

The bit line capping layer BCP may extend in the first direction D1. The bit line capping layer BCP may be on the bit line BL. The bit line capping layer BCP may include an insulating material.

The bit line spacers BS may extend in the first direction D1. The bit line spacers BS may be at opposite sides of the bit line BL and the bit line capping layer BCP. The bit line spacers BS may include an insulating material. In an implementation, the bit line spacer BS may include a plurality of insulating layers.

The dummy bit line structure DBT may include a dummy bit line DBL, a dummy bit line capping layer DBCP, and dummy bit line spacers DBS. The dummy bit line DBL may extend in the first direction D1. The dummy bit line DBL may be on the insulating pattern 110. The dummy bit line DBL may include a conductive material. In an implementation, the dummy bit line DBL may include a plurality of conductive layers.

The dummy bit line capping layer DBCP may extend in the first direction D1. The dummy bit line capping layer DBCP may be on the dummy bit line DBL. The dummy bit line capping layer DBCP may include an insulating material.

The dummy bit line spacers DBS may extend in the first direction D1. The dummy bit line spacers DBS may be at opposite sides of the dummy bit line DBL and the dummy bit line capping layer DBCP. The dummy bit line spacers DBS may include an insulating material. In an implementation, the dummy bit line spacer DBS adjacent to the bit line structure BT from among the dummy bit line spacers DBS may be configured similarly to the bit line spacer BS. In an implementation, the dummy bit line spacer DBS adjacent to the peripheral gate structure PGT from among the dummy bit line spacers DBS may be configured similarly to the peripheral gate spacer PGS.

Insulating fences 120 may be in the cell region CR. The insulating fences 120 may be on the cell gate capping layer CGP of the cell gate structure CGT. The insulating fence 120 may be between adjacent ones of the bit line structures BT or between the bit line structure BT and the dummy bit line structure DBT adjacent to each other. The insulating fences 120 may be at opposite sides of the bit line structure BT. The insulating fence 120 may include an insulating material.

Buried contacts BC may be in the cell region CR. The buried contact BC may be connected to the cell active pattern CAP. The buried contact BC may be between adjacent ones of the insulating fences 120. The buried contacts BC may be at opposite sides of the insulating fence 120. The buried contact BC may include a conductive material. In an implementation, the buried contact BC may include monocrystalline silicon doped with an impurity.

Landing pads LP may be in the cell region CR. The landing pad LP may be on the buried contact BC. The landing pad LP may be between adjacent ones of the insulating fences 120. The landing pads LP may be at opposite sides of the insulating fence 120. The landing pad LP may be electrically connected to the cell active pattern CAP via the buried contact BC. The landing pad LP may include a conductive material. In an implementation, the landing pad LP may include a diffusion barrier layer. In an implementation, a metal silicide layer may be between the landing pad LP and the buried contact BC.

A gate cover layer 130 may be provided. The gate cover layer 130 may cover surfaces of the peripheral gate structures PGT and the dummy bit line structure DBT. The gate cover layer 130 may include an insulating material.

A first filling insulating layer 140 may be on the gate cover layer 130. A portion of the first filling insulating layer 140 may be between adjacent ones of the peripheral gate structures PGT. Another portion of the first filling insulating layer 140 may be between the dummy bit line structure DBT and the peripheral gate structure PGT adjacent to each other. The first filling insulating layer 140 may include an insulating material.

A second filling insulating layer 150 covering surfaces of the gate cover layer 130 and the first filling insulating layer 140 may be provided. The second filling insulating layer 150 may include an insulating material.

Conductive patterns 160 may be on the second filling insulating layer 150. At least one of the conductive patterns 160 may include a contact portion 161 extending in the third direction D3. The conductive pattern 160 may be connected to the cell gate electrode CGE of the cell gate structure CGT, the peripheral gate electrode PGE of the peripheral gate structure PGT, the peripheral active pattern PAP, or the bit line BL of the bit line structure BT.

The contact portion 161 of the conductive patterns 160 may be connected to the cell gate electrode CGE of the cell gate structure CGT. The contact portion 161 of the conductive pattern 160 connected to the cell gate electrode CGE may extend through the first and second filling insulating layers 140 and 150, the gate cover layer 130, the insulating pattern 110, and the cell gate capping layer CGP. The contact portion 161 of the conductive patterns 160 may be connected to the peripheral active pattern PAP. The contact portion 161 of the conductive pattern 160 connected to the peripheral active pattern PAP may extend through the first and second filling insulating layers 140 and 150 and the gate cover layer 130. In an implementation, the conductive patterns 160 may be connected to the peripheral gate electrode PGE of the peripheral gate structure PGT. In an implementation, the conductive patterns 160 may be connected to the bit line BL of the bit line structure BT.

A first separation structure 170 may be provided. The first separation structure 170 may be on the bit line structures BT and the insulating fences 120. The first separation structure 170 may space the landing pads LP from one another. The first separation structure 170 may electrically separate the landing pads LP from one another. The first separation structure 170 may include an insulating material. In an implementation, the first separation structure 170 may include a plurality of insulating layers.

A second separation structure 180 may be provided. The second separation structure 180 may be on the second filling insulating layer 150. The second separation structure 180 may space the conductive patterns 160 from one another. The second separation structure 180 may electrically separate the conductive patterns 160 from one another. The second separation structure 180 may include an insulating material. In an implementation, the second separation structure 180 may include a plurality of insulating layers.

A wiring insulating layer 190 covering top surfaces of the landing pads LP, the conductive patterns 160, the first separation structure 170, and the second separation structure 180 may be provided. The wiring insulating layer 190 may extend from the cell region CR to the peripheral region PR. The wiring insulating layer 190 may include an insulating material.

A capacitor structure CT may be on the wiring insulating layer 190. The capacitor structure CT may be in the cell region CR. The capacitor structure CT may include lower electrodes LE, a capacitor insulating layer CI, capacitor support layers CS, and an upper electrode UE. The capacitor structure CT may be connected to the landing pad LP. The capacitor structure CT may be electrically connected to the cell active pattern CAP via the landing pad LP and the buried contact BC.

The lower electrodes LE may have the form of a pillar extending in the third direction D3. The lower electrode LE may be connected to the landing pad LP and may extend through the wiring insulating layer 190. The capacitor support layers CS may support the lower electrodes LE. The capacitor support layer CS may be connected to sidewalls of adjacent ones of the lower electrodes LE. A plurality of capacitor support layers CS may be connected to one lower electrode LE at different levels.

The capacitor insulating layer CI may cover surfaces of the lower electrodes LE, the capacitor support layers CS, and the wiring insulating layer 190. In an implementation, the capacitor insulating layer CI may include a plurality of insulating layers. The capacitor insulating layer CI may be in the cell region CR. The capacitor insulating layer CI may not be in the peripheral region PR. The capacitor insulating layer CI may cover a top surface of a portion of the wiring insulating layer 190 in the cell region CR.

The upper electrode UE may surround the lower electrodes LE, the capacitor support layers CS and the capacitor insulating layer CI. The upper electrode UE may cover the lower electrodes LE, the capacitor support layers CS and the capacitor insulating layer CI. The lower electrodes LE may be spaced apart from the upper electrode UE by the capacitor insulating layer CI. In an implementation, the capacitor insulating layer CI may be between the lower electrodes LE and the upper electrode UE.

The capacitor insulating layer CI and the capacitor support layers CS may include an insulating material. The lower electrodes LE and the upper electrode UE may include a conductive material.

An interlayer insulating layer IL surrounding the capacitor structure CT may be provided. The interlayer insulating layer IL may be at or on the peripheral region PR and an outer portion of the cell region CR. The interlayer insulating layer IL may overlap with the peripheral transistor in the third direction D3. The interlayer insulating layer IL may overlap with the peripheral gate structure PGT and the peripheral active pattern PAP in the third direction D3. The interlayer insulating layer IL may contact an outer sidewall CT_S of the capacitor structure CT. The outer sidewall CT_S of the capacitor structure CT may be an outer sidewall of the upper electrode UE. The outer sidewall CT_S of the capacitor structure CT contacting the interlayer insulating layer IL may be curved. The interlayer insulating layer IL may be on the wiring insulating layer 190. In an implementation, a top surface of the interlayer insulating layer IL may be coplanar with a top surface CT_T of the capacitor structure CT. The top surface CT_T of the capacitor structure CT may be a top surface of the upper electrode UE.

The interlayer insulating layer IL may include a first material layer LA1, and a second material layer LA2 on the first material layer LA1. The first material layer LA1 may surround the capacitor structure CT. The first material layer LA1 may include a sidewall portion LA1_S contacting (e.g., directly contacting) the outer sidewall CT_S of the capacitor structure CT, and a flat portion LA1_F contacting (e.g., directly contacting) the wiring insulating layer 190. The sidewall portion LA1_S of the first material layer LA1 may cover the entirety of the outer sidewall CT_S of the capacitor structure CT. The sidewall portion LA1_S of the first material layer LA1 may be between the capacitor structure CT and the second material layer LA2. The flat portion LA1_F of the first material layer LA1 may contact a top surface of the wiring insulating layer 190. The flat portion LA1_F of the first material film LA1 may be between the conductive patterns 160 and the second material layer LA2. The flat portion LA1_F of the first material layer LA1 may be between the wiring insulating layer 190 and the second material layer LA2. The flat portion LA1_F of the first material layer LA1 may extend from the sidewall portion LA1_S of the first material layer LA1, e.g., in a horizontal direction. In an implementation, a bottom surface of the flat portion LA1_F of the first material layer LA1 may be coplanar with a bottom surface of the capacitor insulating layer CI of the capacitor structure CT. In an implementation, a top surface LA1_ST of the sidewall portion LA1_S of the first material layer LA1, a top surface LA2_T of the second material layer LA2, and the top surface CT_T of the capacitor structure CT may be coplanar. In this case, the top surface LA1_ST of the sidewall portion LA1_S of the first material layer LA1, the top surface LA2_T of the second material layer LA2, and the top surface CT_T of the capacitor structure CT may be at a same level (e.g., a same distance in the third direction D3 from the substrate 100). The second material layer LA2 may surround the sidewall portion LA1_S of the first material layer LA1. As used herein, the terms "first," "second," and the like are merely for identification and differentiation, and are not intended to imply or require sequential inclusion (e.g., a third element and a fourth element may be described without implying or requiring the presence of a first element or second element).

Each of the sidewall portion LA1_S and the flat portion LA1_F of the first material layer LA1 may have a uniform thickness. In an implementation, the sidewall portion LA1_S of the first material layer LA1 may have a uniform thickness in the horizontal direction (e.g., second direction D2), and the flat portion LA1_F of the first material layer LA1 may have a uniform thickness in the vertical direction (e.g., third direction D3). In an implementation, the thickness of the flat portion LA1_F of the first material layer LA1 may be, e.g., about 500 Å. The sidewall portion LA1_S of the first material layer LA1 may be curved corresponding to (e.g., may be conformally on) the outer sidewall CT_S of the capacitor structure CT. An inner sidewall and an outer sidewall of the sidewall portion LA1_S of the first material layer LA1 may be curved. The second material layer LA2 may be at a higher level (e.g., farther from the substrate 100 in the third direction D3) than the flat portion LA1_F of the first material layer LA1. The second material layer LA2 may be at the same level (e.g., same distance from the substrate 100 in the third direction D3) as the sidewall portion LA1_S of the first material layer LA1, The first material layer LA1 and the second material layer LA2 may include different insulating materials, respectively. In an implementation, the first material layer LA1 and the second material layer LA2 may include an insulating material including hydrogen, and the hydrogen concentration of the first material layer LA1 may be higher than the hydrogen concentration of the second material layer LA2. In an implementation, the first material layer LA1 and the second material layer LA2 may each include tetraethyl orthosilicate (TEOS), and the hydrogen concentration of the first material layer LA1 may be higher than the hydrogen concentration of the second material layer LA2. In an implementation, the hydrogen concentration of the first material layer LA1 may be, e.g., about 4.1%, and the hydrogen concentration of the second material layer LA2 may be, e.g., about 3%. The hydrogen concentration of the first material layer LA1 and the hydrogen concentration of the second material layer LA2 may be discontinuously varied (e.g., may be discontinuous) at a boundary between the first material layer LA1 and the second material layer LA2.

In an implementation, the first material layer LA1 may include an insulating material including hydrogen and deuterium, and the second material layer LA2 may include an insulating material including hydrogen (e.g., and essentially free of deuterium).

In a process of forming the interlayer insulating layer IL, the first material layer LA1 may be formed using a first deposition material, and the second material layer LA2 may be formed using a second deposition material. In an implementation, the hydrogen concentration of the first deposition material may be higher than the hydrogen concentration of the second deposition material and, as such, the hydrogen concentration of the first material layer LA1 may be higher than the hydrogen concentration of the second material layer LA2.

A peripheral contact PC extending through the interlayer insulating layer IL may be provided. The peripheral contact PC may extend in the third direction D3. The peripheral contact PC may extend through the second material layer LA2 and the flat portion LA1_F of the first material layer LA1 of the interlayer insulating layer IL, and through the wiring insulating layer 190. The peripheral contact PC may be connected to the conductive pattern 160. In an implementation, as shown in FIG. 1E, the peripheral contact PC may be connected to the conductive pattern 160 connected to the peripheral active pattern PAP. In an implementation, the conductive pattern 160 connected to the peripheral contact PC may be connected to the peripheral active pattern PAP, the peripheral gate electrode PGE of the peripheral gate structure PGT, the cell gate electrode CGE of the cell gate structure CGT, or the bit line BL of the bit line structure BT.

Referring to FIG. 1F, the peripheral contact PC may include a first portion PC_1 contacting (e.g., in) the flat portion LA1_F of the first material layer LA1, a second portion PC_2 contacting (e.g., in) the second material layer LA2, and a third portion PC_3 contacting (e.g., in) the wiring insulating layer 190 and the conductive pattern 160. A sidewall of the first portion PC_1 of the peripheral contact PC may contact (e.g., directly contact) the flat portion LA1_F of the first material layer LA1, and a sidewall of the second portion PC_2 of the peripheral contact PC may contact (e.g., directly contact) the second material layer LA2.

The first portion PC_1 of the peripheral contact PC may be a portion at the same level as (e.g., laterally adjacent to) the flat portion LA1_F of the first material layer LA1, and the second portion PC_2 of the peripheral contact PC may be a portion at the same level as (e.g., laterally adjacent to) the second material layer LA2. The first portion PC_1 of the peripheral contact PC may be at a lower level than the second portion PC_2 of the peripheral contact PC2.

A maximum width of the first portion PC_1 of the peripheral contact PC (e.g., in the first direction D1) may be greater than a minimum width of the second portion PC_2 of the peripheral contact PC. In an implementation, the width in the first direction D1 of the first portion PC_1 of the peripheral contact PC may be defined as a first width W1, the width in the first direction D1 of the second portion PC_2 of the peripheral contact PC may be defined as a second width W2, and the maximum value of the first width W1 may be greater than the minimum value of the second width W2.

A boundary BO between the first portion PC_1 and the second portion PC_2 of the peripheral contact PC may be defined. The level of the boundary BO between the first portion PC_1 and the second portion PC_2 of the peripheral contact PC may be equal to or the same as the level of a top surface of the flat portion LA1_F of the first material layer LA1 and the level of a bottom surface of the second material layer LA2. The first portion PC_1 of the peripheral contact PC may have a maximum width at a first level LV1 lower (e.g., closer to the substrate 100 in the third direction D3) than the boundary BO. In an implementation, the first width W1 may be the maximum at the first level LV1. The second portion PC_2 of the peripheral contact PC may have a minimum width at the boundary BO. In an implementation, the second width W2 may be the minimum at the boundary BO.

In the semiconductor device according to the exemplary embodiments of the disclosure, the hydrogen concentration of the first material layer LA1 may be higher than the hydrogen concentration of the second material layer LA2. In an implementation, the amount of hydrogen diffused in the first material LA1 relatively near or proximate to the cell transistors may be relatively great and, as such, dangling bonds formed at interfaces of the cell transistors may be relatively reduced. As a result, loss of charges of the capacitor structure CT caused by dangling bonds may be relatively reduced and, as such, electrical characteristics of the semiconductor device may be enhanced.

In an implementation, the semiconductor device according to the exemplary embodiments of the disclosure may include the first material layer LA1, which has a relatively high hydrogen concentration, it may be possible to relatively lower the hydrogen concentration of insulating layers at higher levels than the interlayer insulating layer IL and, as such, reliability of the insulating layers disposed at higher levels than the interlayer insulating layer IL may be enhanced.

Figure 2A:
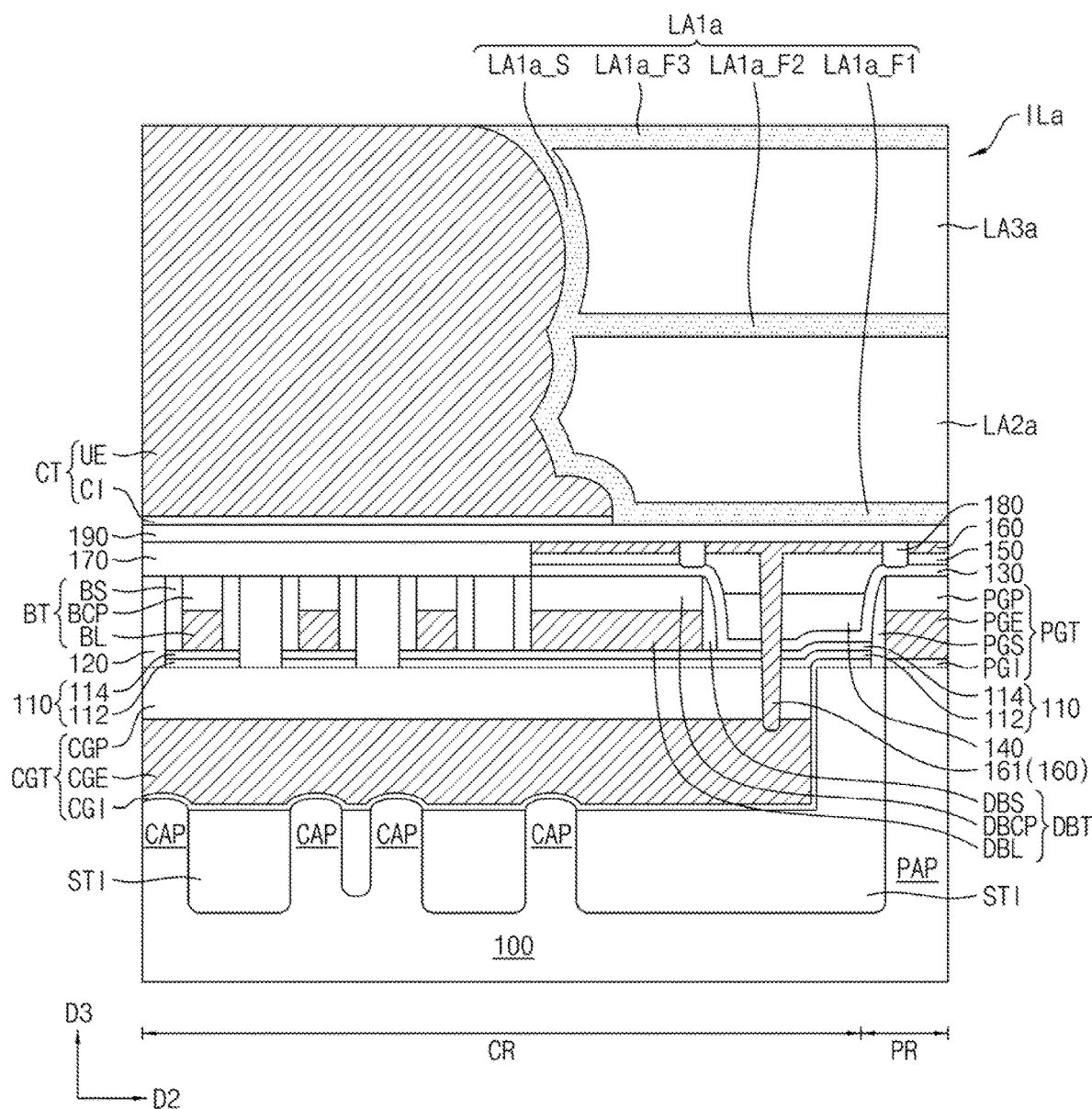
FIGS. 2A and 2B are cross-sectional views of a semiconductor device according to some exemplary embodiments of the disclosure.
Figure 2B:
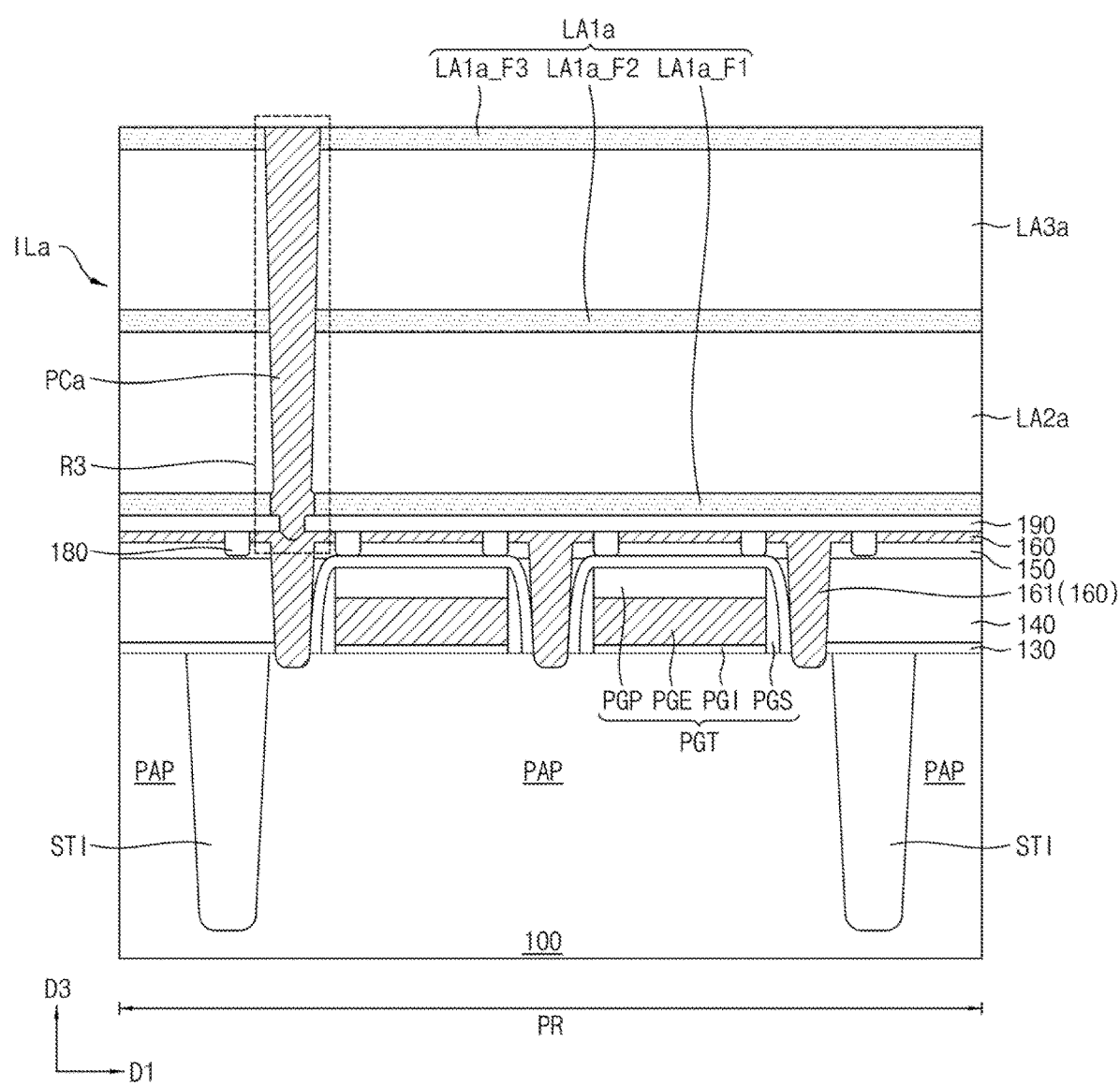
Figure 2C:
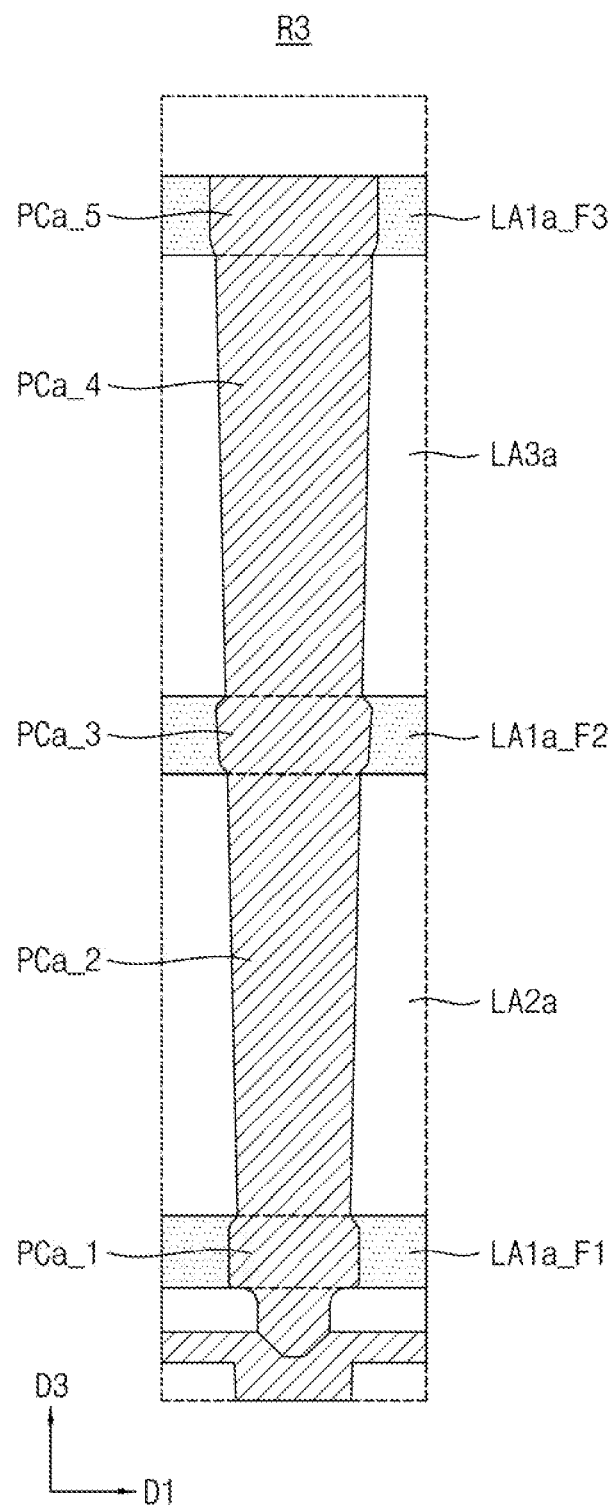
FIG. 2C is an enlarged view of a region R3 of FIG. 2B.

FIGS. 2A and 2B are cross-sectional views of a semiconductor device according to some exemplary embodiments of the disclosure. FIG. 2C is an enlarged view of a region R3 of FIG. 2B. In the following description, repeated description of constituent elements similar to those of the semiconductor device according to FIGS. 1A to 1F may be omitted.

Referring to FIGS. 2A and 2B, in the semiconductor device according to the exemplary embodiments of the disclosure, an interlayer insulating layer ILa surrounding a capacitor structure CT may be provided. The interlayer insulating layer ILa may include a first material layer LA1a, a second material layer LA2a, and a third material layer LA3a. In an implementation, the first to third material layers LA1a, LA2a and LA3a may include an insulating material including hydrogen. In an implementation, the hydrogen concentration of the first material layer LA1a may be higher than the hydrogen concentrations of the second and third material layers LA2a and LA3a, and the hydrogen concentrations of the second and third material layers LA2a and LA3a may be equal. In an implementation, the first material layer LA1a may include an insulating material including hydrogen and deuterium, and the second and third material layers LA2a and LA3a may include an insulating material including hydrogen (e.g., and may be essentially free of deuterium).

The first material layer LA1a may include a sidewall portion LA1a S, a first flat portion LA1a_F1, a second flat portion LA1a_F2, and a third flat portion LA1a_F3. The first flat portion LA1a_F1, the second flat portion LA1a_F2, and the third flat portion LA1a_F3 may extend from the sidewall portion LA1a S, e.g., in the horizontal direction (e.g., second direction D2).

The second material layer LA2a may be at a higher level than the first flat portion LA1a_F1. The second flat portion LA1a_F2 may be at a higher level than the second material layer LA2a, and may be at a lower level than the third material layer LA3a. The second flat portion LA1a_F2 may be between the second and third material layers LA2a and LA3a. The second material layer LA2a may be between the first and second flat portions LA1a_F1 and LA1a_F2. The third flat portion LA1a_F3 may be at a higher level than the third material layer LA3a. The third material layer LA3a may be between the second and third flat portions LA1a_F2 and LA1a_F3. A top surface of the third flat portion LA1a_F3 may be coplanar with a top surface of the capacitor structure CT.

In an implementation, the number of flat portions included in the first material layer LA1a may be two or less, or may be four or more.

A peripheral contact PCa extending through the first to third flat portions LA1a_F1, LA1a_F2 and LA1a_F3 of the first material layer LA1a, the second material layer LA2a, and the third material layer LA3a may be provided.

Referring to FIG. 2C, the peripheral contact PCa may include a first portion PCa_1 contacting the first flat portion LA1a_F1 of the first material layer LA1a, a second portion PCa_2 contacting the second material layer LA2a, a third portion PCa_3 contacting the second flat portion LA1a_F2 of the first material layer LA1a, a fourth portion PCa_4 contacting the third material layer LA3a, and a fifth portion PCa_5 contacting the third flat portion LA1a_F3 of the first material layer LA1a.

A maximum width of the first portion PCa_1 of the peripheral contact PCa may be greater than a minimum width of the second portion PCa_2 of the peripheral contact PCa. A maximum width of the third portion PCa_3 of the peripheral contact PCa may be greater than a minimum width of the fourth portion PCa_4 of the peripheral contact PCa and a maximum width of the second portion PCa_2 of the peripheral contact PCa. A maximum width of the fifth portion PCa_5 of the peripheral contact PCa may be greater than a maximum width of the fourth portion PCa_4 of the peripheral contact PCa.

Figure 3A:
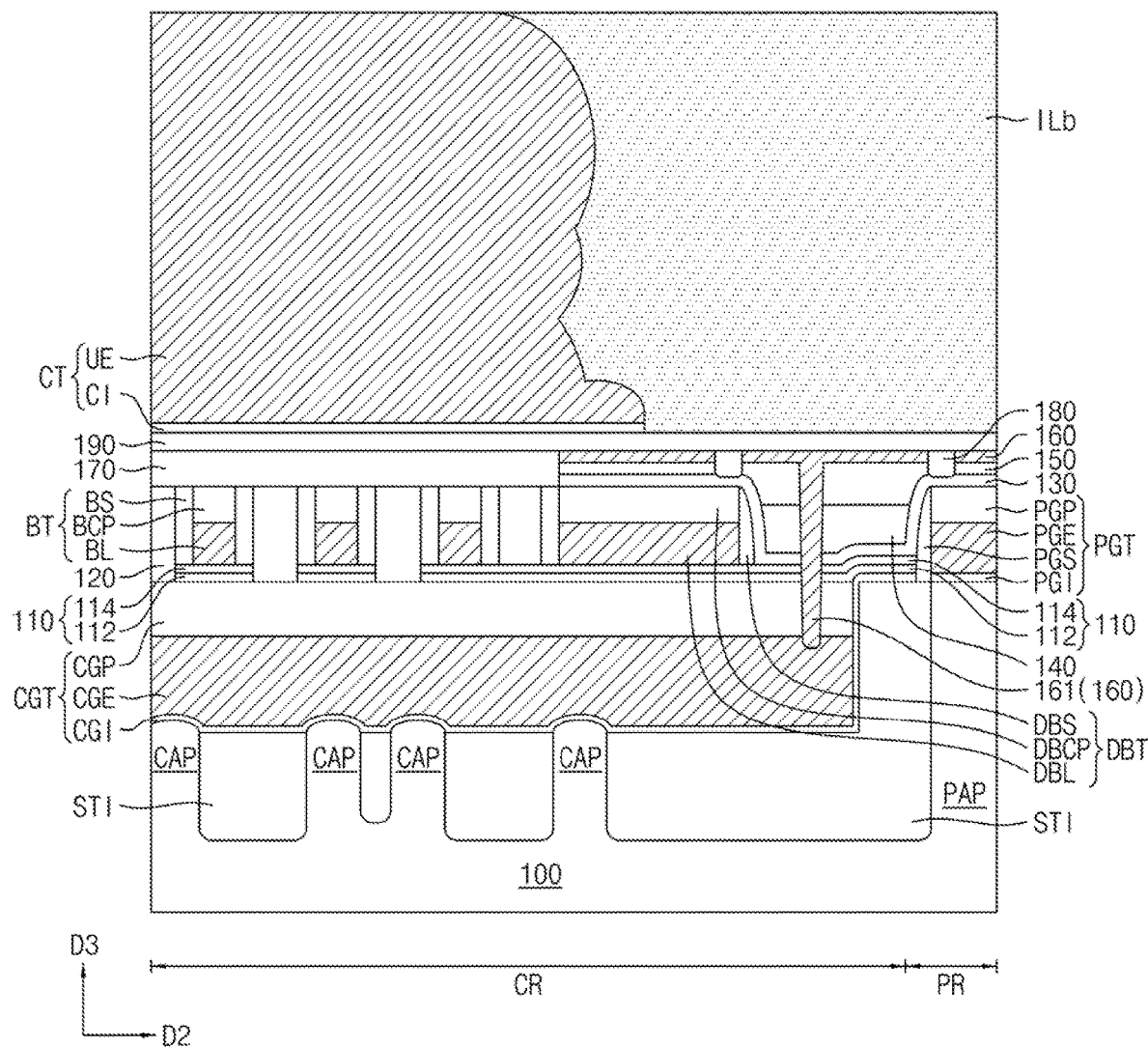
FIGS. 3A and 3B are cross-sectional views of a semiconductor device according to some exemplary embodiments of the disclosure.
Figure 3B:
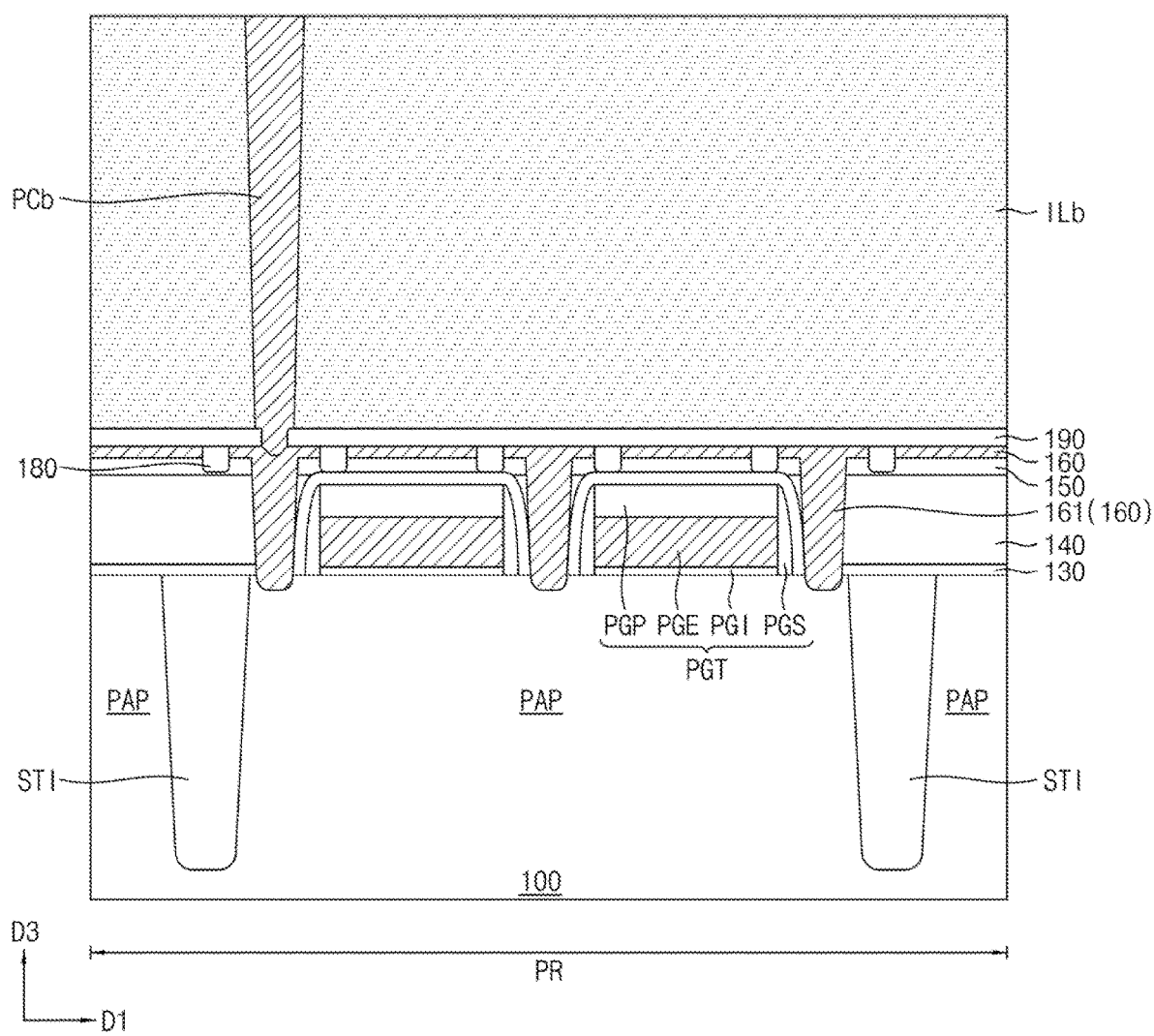

FIGS. 3A and 3B are cross-sectional views of a semiconductor device according to some exemplary embodiments of the disclosure. In the following description, repeated description of constituent elements similar to those of the semiconductor device according to FIGS. 1A to 1F may be omitted.

Referring to FIGS. 3A and 3B, in the semiconductor device according to the exemplary embodiments of the disclosure, an interlayer insulating layer ILb surrounding a capacitor structure CT may be provided. In an implementation, the interlayer insulating layer ILb may include an insulating material having a relatively high hydrogen concentration. In an implementation, the interlayer insulating layer ILb may include TEOS, and the hydrogen concentration thereof may be, e.g., about 4.1%. In an implementation, the interlayer insulating layer ILb may include an insulating material including hydrogen and deuterium.

A peripheral contact PCb extending through the interlayer insulating layer ILb may be provided. The width of the peripheral contact PCb (e.g., in the first direction D1) may be gradually reduced as the level of the peripheral contact PCb is lowered (e.g., along the third direction D3 toward the substrate 100).

Figure 3C:
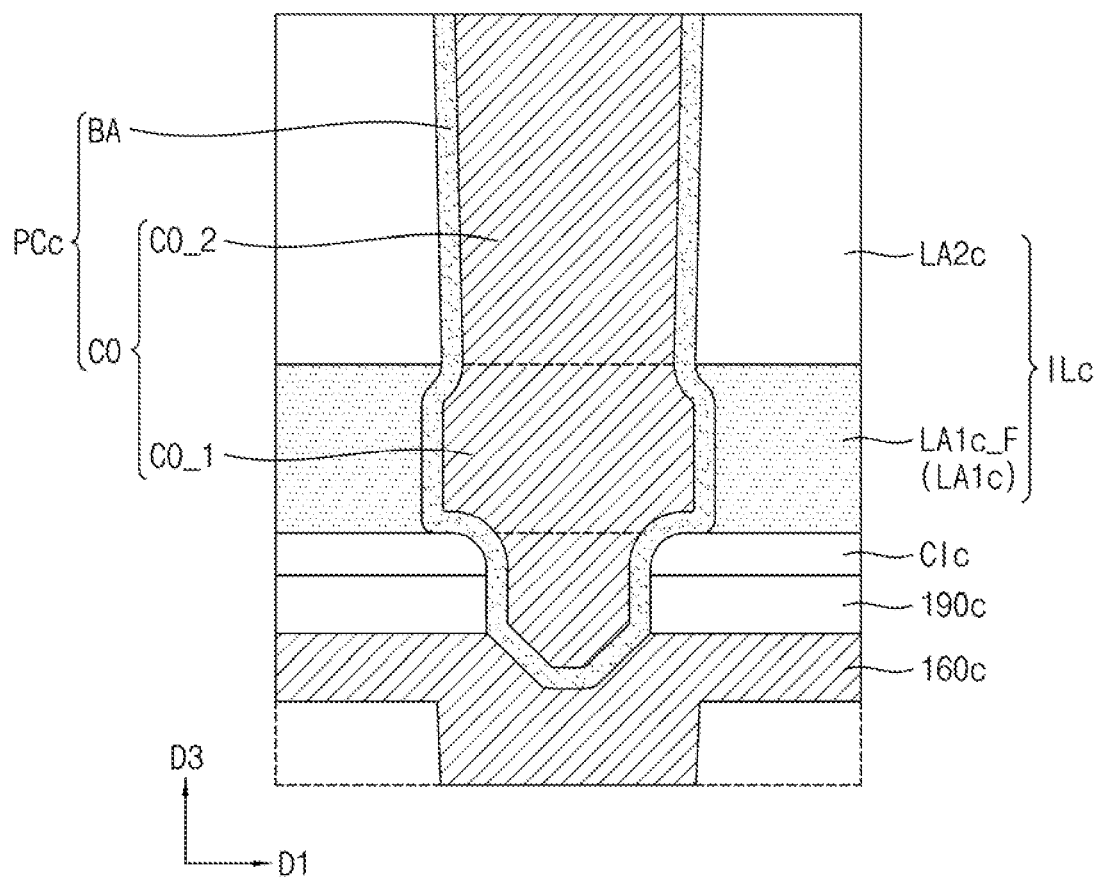
FIG. 3C is an enlarged view of a portion of a semiconductor device according to some exemplary embodiments of the disclosure.

FIG. 3C is an enlarged view of a portion of a semiconductor device according to some exemplary embodiments of the disclosure.

Referring to FIG. 3C, a peripheral contact PCc of the semiconductor device according to the exemplary embodiments of the disclosure may extend through a wiring insulating layer 190c, a capacitor insulating layer CIc, and an interlayer insulating layer ILc. The capacitor insulating layer CIc may extend from a cell region to a peripheral region. A portion of the capacitor insulating layer CIc in the cell region may be between a lower electrode and an upper electrode of a capacitor structure, and a portion of the capacitor insulating layer CIc in the peripheral area may be between a conductive pattern 160c and a flat portion LA1c_F of a first material layer LA1c of the interlayer insulating layer ILc.

The peripheral contact PCc may include a conductive layer CO and a barrier layer BA. The barrier layer BA may surround the conductive layer CO. In an implementation, the conductive layer CO may include, e.g., tungsten (W), and the barrier layer BA may include, e.g., titanium (Ti) or tantalum (Ta).

The conductive layer CO may include a first portion CO_1 at the same level as (e.g., laterally adjacent to) the flat portion LA1c_F of the first material layer LA1c, and a second portion CO_2 at the same level as a second material layer LA2c. A maximum width of the first portion CO_1 of the conductive layer CO may be greater than a minimum width of the second portion CO_2 of the conductive layer CO.

By way of summation and review, semiconductor devices may have high reliability, high speed, multifunctionalization, or the like. In order to satisfy such characteristics, structures in semiconductor devices may be more and more complicated. In addition, semiconductor devices may be more and more highly integrated.

In the semiconductor device according to the exemplary embodiments of the disclosure, an interlayer insulating layer may include a material layer having a relatively high hydrogen concentration and, as such, dangling bonds in the semiconductor device may be relatively reduced. Accordingly, electrical characteristics of the semiconductor device may be enhanced.

One or more embodiments may provide a semiconductor device having enhanced electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
 a cell active pattern;
 a cell gate structure connected to the cell active pattern;
 a peripheral active pattern;
 a peripheral gate structure connected to the peripheral active pattern;
 a conductive pattern connected to the peripheral active pattern, the cell gate structure, or the peripheral gate structure;
 a capacitor structure electrically connected to the cell active pattern;

an interlayer insulating layer on the capacitor structure; and a peripheral contact connected to the conductive pattern and extending through the interlayer insulating layer, wherein:

the interlayer insulating layer includes a first material layer contacting the capacitor structure, and a second material layer on the first material layer, the first material layer being at a vertical level between a lowermost vertical level of the second material layer and a vertical level of the cell active pattern, the peripheral contact includes a first portion contacting the first material layer, and a second portion contacting the second material layer, and the maximum horizontal width of the first portion of the peripheral contact is greater than the minimum horizontal width of the second portion of the peripheral contact.

2. The semiconductor device as claimed in claim 1, wherein a hydrogen concentration of the first material layer is higher than a hydrogen concentration of the second material layer.

3. The semiconductor device as claimed in claim 1, wherein:

the first material layer includes hydrogen and deuterium; and the second material layer includes hydrogen.

4. The semiconductor device as claimed in claim 1, wherein the first material layer includes:

a sidewall horizontally between the second material layer and the capacitor structure, and a first flat portion including a horizontal flat surface vertically between the second material layer and the conductive pattern.

5. The semiconductor device as claimed in claim 4, wherein the first portion of the peripheral contact contacts the first flat portion of the first material layer.

6. The semiconductor device as claimed in claim 5, wherein the first material layer further includes a second flat portion at a higher level than the second material layer.

7. The semiconductor device as claimed in claim 6, wherein:

the interlayer insulating layer further includes a third material layer at a higher level than the second flat portion of the first material layer, a hydrogen concentration of the first material layer is higher than a hydrogen concentration of the second material layer, and the hydrogen concentration of the first material layer is higher than a hydrogen concentration of the third material layer.

8. The semiconductor device as claimed in claim 7, wherein:

the peripheral contact further includes a third portion contacting the second flat portion of the first material layer, and a fourth portion contacting the third material layer; and the maximum horizontal width of the third portion is greater than the minimum horizontal width of the fourth portion.

9. A semiconductor device, comprising:

a cell active pattern;

a cell gate structure connected to the cell active pattern;

a capacitor structure electrically connected to the cell active pattern;

an interlayer insulating layer on the capacitor structure; and a peripheral contact extending through the interlayer insulating layer, wherein:

the interlayer insulating layer includes a first material layer, and a second material layer having a lower hydrogen concentration than a hydrogen concentration of the first material layer, the first material layer includes a sidewall contacting and covering an outer sidewall of the capacitor structure, and a first flat portion extending horizontally from the sidewall, the second material layer is at a higher level than the first flat portion of the first material layer, and is on the sidewall of the first material layer, the peripheral contact includes a first portion contacting the first flat portion of the first material layer, and a second portion contacting the second material layer, and the maximum horizontal width of the first portion is greater than the minimum horizontal width of the second portion.

10. The semiconductor device as claimed in claim 9, further comprising:

a conductive pattern connected to the cell gate structure; and a wiring insulating layer covering the conductive pattern, wherein the first flat portion of the first material layer is between the second material layer and the wiring insulating layer.

11. The semiconductor device as claimed in claim 10, wherein:

the capacitor structure includes a lower electrode, an upper electrode, and a capacitor insulating layer; and a portion of the capacitor insulating layer is between the first flat portion of the first material layer and the conductive pattern.

12. The semiconductor device as claimed in claim 10, wherein the peripheral contact is connected to the conductive pattern and extends through the wiring insulating layer.

13. The semiconductor device as claimed in claim 9, further comprising:

a peripheral active pattern; and a peripheral gate structure connected to the peripheral active pattern, wherein the interlayer insulating layer overlaps with the peripheral active pattern and the peripheral gate structure.

14. The semiconductor device as claimed in claim 9, wherein a hydrogen concentration at a boundary between the first material layer and the second material layer is discontinuous.

15. A semiconductor device, comprising:

a cell active pattern;

a cell gate structure connected to the cell active pattern;

a capacitor structure electrically connected to the cell active pattern;

a first material layer including a sidewall covering an outer sidewall of the capacitor structure, and a first flat bottom portion extending horizontally from the sidewall; and a second material layer on the sidewall of the first material layer and having a sidewall facing and contacting the sidewall of the first material layer, wherein:

the second material layer is at a higher level than the first flat bottom portion of the first material layer, and a hydrogen concentration of the first material layer is higher than a hydrogen concentration of the second material layer.

16. The semiconductor device as claimed in claim 15, wherein:
the first material layer further includes a second flat portion at a higher level than the second material layer;
the second flat portion of the first material layer extends from the sidewall of the first material layer;
the semiconductor device further includes a third material layer at a higher level than the second flat portion of the first material layer; and
a hydrogen concentration of the third material layer is equal to the hydrogen concentration of the second material layer.

17. The semiconductor device as claimed in claim 16, wherein:
the first material layer further includes a third flat portion at a higher level than the third material layer;
the third flat portion of the first material layer extends from the sidewall of the first material layer; and
a top surface of the third flat portion of the first material layer is coplanar with a top surface of the capacitor structure.

18. The semiconductor device as claimed in claim 15, wherein:
the sidewall of the first material layer has a uniform thickness in a horizontal direction; and
the first flat bottom portion of the first material layer has a uniform thickness in a vertical direction.

19. The semiconductor device as claimed in claim 15, wherein a top surface of the sidewall of the first material layer, a top surface of the second material layer, and a top surface of the capacitor structure are coplanar.

20. The semiconductor device as claimed in claim 15, wherein:
the capacitor structure includes a lower electrode, an upper electrode, and a capacitor insulating layer between the lower electrode and the upper electrode; and
a bottom surface of the first flat bottom portion of the first material layer is coplanar with a bottom surface of the capacitor insulating layer.

* * * * *